United States Patent [19]
Yamaguchi

[11] Patent Number: 5,315,248
[45] Date of Patent: May 24, 1994

[54] METHOD AND APPARATUS FOR NUCLEAR MAGNETIC RESONANCE FOR MEASURING SPEED OF FLOWING TARGET OBJECT

[75] Inventor: Kojiro Yamaguchi, Tochigiken, Japan

[73] Assignee: Kabushiki Kaisha Toshiba, Kawasaki, Japan

[21] Appl. No.: 23,311

[22] Filed: Feb. 26, 1993

[30] Foreign Application Priority Data

Mar. 2, 1992 [JP] Japan .................................. 4-044672

[51] Int. Cl.$^5$ .............................................. G01V 3/00
[52] U.S. Cl. ..................................... 324/306; 324/309
[58] Field of Search ............... 324/300, 307, 309, 310, 324/311, 312, 313, 314, 318, 322; 128/653.2, 653.5

[56] References Cited

U.S. PATENT DOCUMENTS

| | | | |
|---|---|---|---|
| 4,849,697 | 7/1989 | Cline et al. | 324/306 |
| 5,034,694 | 7/1991 | Sattin et al. | 324/309 |
| 5,225,779 | 7/1993 | Parker et al. | 324/306 |
| 5,245,282 | 9/1993 | Mugler, III et al. | 324/309 |

Primary Examiner—Michael J. Tokar
Attorney, Agent, or Firm—Limbach & Limbach

[57] ABSTRACT

A nuclear magnetic resonance imaging for measuring a speed of a flowing target object, capable of determining the speed of the flowing target object accurately, even for the high speed flowing target object. Timings for an application of a pre-saturation pulse to a saturation plane producing a saturated portion within the flowing target object and an execution of an imaging pulse sequence to collect NMR signals from a desired imaging region containing a saturation plane and the saturated portion are controlled to realize a single slice multiphase pulse sequence, at each phase of which an application of the pre-saturation pulse is followed by an execution of the desired imaging pulse sequence. The speed of the flowing target object is then determined by measuring a distance between the saturated portion and the saturation plane in each reconstructed NMR image, and dividing the measured distance by a time interval between an application of the pre-saturation pulse and a reception of the NMR signals in the single slice multiphase pulse sequence.

10 Claims, 3 Drawing Sheets

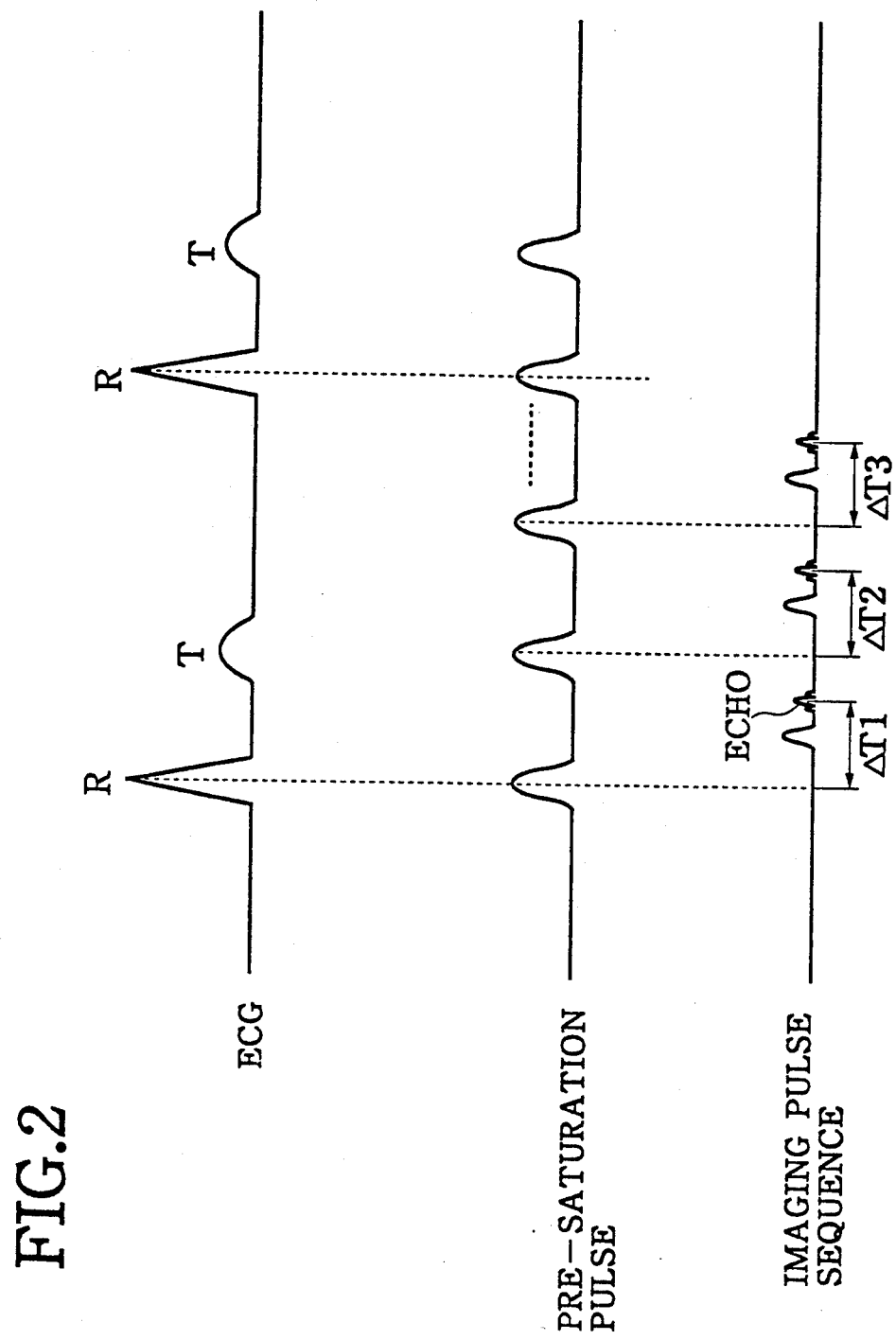

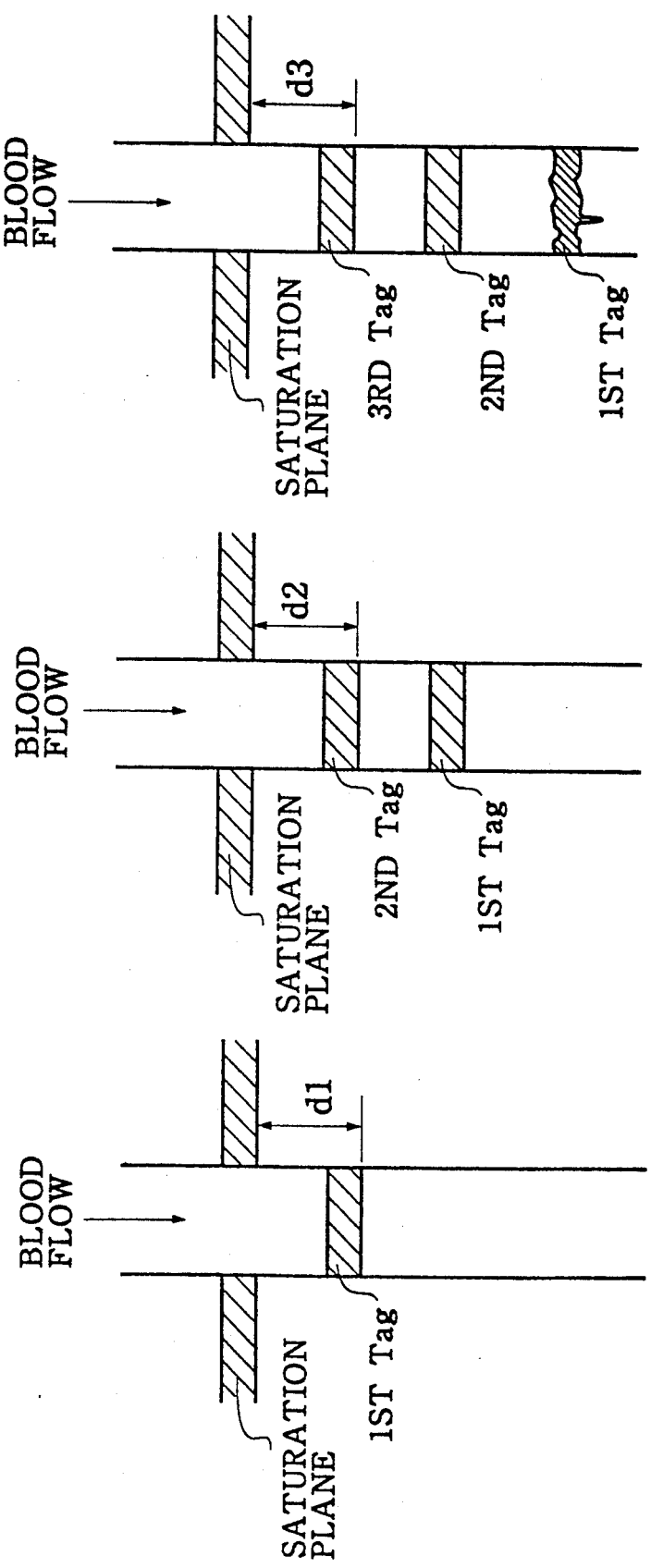

METHOD AND APPARATUS FOR NUCLEAR MAGNETIC RESONANCE FOR MEASURING SPEED OF FLOWING TARGET OBJECT

BACKGROUND OF THE INVENTION

1. Field of the Invention

The present invention relates to a nuclear magnetic resonance (NMR) imaging for obtaining tomographic information and spectroscopic information of an object to be examined, and more particularly, to a measurement a speed of a flowing target object such as blood by utilizing the NMR imaging.

2. Description of the Background Art

An NMR imaging has been known as a method for obtaining tomographic information and spectroscopic information of an object to be examined non-invasively, and it is known conventionally that this NMR imaging can be utilized in measuring a speed of a flowing target object such as blood or cerebrospinal fluid.

Namely, when an imaging target blood vessel is placed along a Z axis, a pre-saturation pulse is applied to a saturation plane located in a direction perpendicularly intersecting this blood vessel, such as a direction along an X axis, in order to selectively saturate only those spin components of the blood flowing in this blood vessel which are located within this saturation plane. For the pre-saturation pulse, 90 degree pulse is normally used.

Then, the usual NMR imaging for taking an image of a slicing plane containing this blood vessel, such as a slicing plane along a Y axis, is carried out by the application of appropriate RF pulses and gradient magnetic fields according to a desired imaging pulse sequence such as a spin echo (SE) sequence or a field echo (FE) sequence, and the NMR echo signals are collected after an elapse of an echo time TE, such that the NMR image of the blood vessel can be reconstructed from the collected NMR echo signals. In the reconstructed NMR image of the blood vessel, the spin components saturated by the pre-saturation pulse appear as a dark region called Tag portion.

Here, the Tag portion has flowed through the blood vessel for a distance d from the position of the saturation plane during the time period T between the application of the pre-saturation pulse and the detection of the NMR echo signals, so that the Tag portion appears to be displaced from the saturation plane by the distance d in the reconstructed NMR image. Consequently, by measuring this distance d between the position of the saturation plane and the Tag portion on the reconstructed NMR image, it becomes possible to determine the speed of the blood flow as $V = d/T$. Usually, this type of measurement is repeated for measurements are averaged in order to remove the temporal fluctuation factor.

However, in this conventional method of measuring the speed of the blood flow, when the speed of the blood flow becomes faster than a certain limit speed, the shape of the Tag portion is disturbed by the turbulence in the blood flowing in vicinity of the Tag portion, such that the moving distance d of the Tag portion cannot be determined accurately and consequently the speed of the blood flow cannot be determined accurately. As a consequence, it has been difficult conventionally to accurately measure the speed of the fast blood flow such as those in the major blood vessels.

SUMMARY OF THE INVENTION

It is therefore an object of the present invention to provide a method and an apparatus for a nuclear magnetic resonance imaging for measuring a speed of a flowing target object, capable of determining the speed of the flowing target object accurately, even for the high speed flowing target object.

According to one aspect of the present invention there is provided an apparatus for nuclear magnetic resonance imaging for measuring a speed of a flowing target object, comprising: pre-saturation means for applying a pre-saturation pulse to a desired saturation plane perpendicularly intersecting a flowing direction of the flowing target object, so as to produce a saturated portion within the flowing target object; imaging means for executing a desired imaging pulse sequence to collect nuclear magnetic resonance signals from a desired imaging region containing the saturation plane and the saturated portion; control means for controlling the pre-saturation means and the imaging means to realize a single slice multi-phase pulse sequence, at each phase of which an application of the pre-saturation pulse by the pre-saturation means is followed by an execution of the desired imaging pulse sequence by the imaging means; and means for determining the speed of the flowing target object by reconstructing a nuclear magnetic resonance image of the desired imaging region from the nuclear magnetic resonance signals collected by the imaging means at each phase of the single slice multi-phase pulse sequence, measuring a distance between the saturated portion and the saturation plane in each reconstructed nuclear magnetic resonance image, and dividing the measured distance by a time interval between an application of the pre-saturation pulse and a reception of the nuclear magnetic resonance signals in the single slice multi-phase pulse sequence.

According to another aspect of the present invention there is provided a method of nuclear magnetic resonance imaging for measuring a speed of a flowing target object, comprising the step of: applying a pre-saturation pulse to a desired saturation plane perpendicularly intersecting a flowing direction of the flowing target object, so as to produce a saturated portion within the flowing target object; executing a desired imaging pulse sequence to collect nuclear magnetic resonance signals from a desired imaging region containing the saturation plane and the saturated portion; controlling timings of the applying step and the executing step to realize a single slice multi-phase pulse sequence, at each phase of which an application of the pre-saturation pulse by the applying step is followed by an execution of the desired imaging pulse sequence by the executing step; and determining the speed of the flowing target object by reconstructing a nuclear magnetic resonance image of the desired imaging region from the nuclear magnetic resonance signals collected at the executing step at each phase of the single slice multi-phase pulse sequence, measuring a distance between the saturated portion and the saturation plane in each reconstructed nuclear magnetic resonance image, and dividing the measured distance by a time interval between an application of the pre-saturation pulse and a reception of the nuclear magnetic resonance signals in the single slice multi-phase pulse sequence.

Other features and advantages of the present invention will become apparent from the following description taken in conjunction with the accompanying drawings.

BRIEF DESCRIPTION OF THE DRAWINGS

FIG. 2 is an exemplary timing chart for the electro-cardiographic waveform, the pre-saturation pulse application, and the imaging pulse sequence, in one embodiment of a nuclear magnetic resonance imaging for measuring a speed of a flowing target object according to the present invention.

FIGS. 3A, 3B, and 3C are illustrations of the NMR images of a flowing target object obtained in one embodiment of a nuclear magnetic resonance imaging for measuring a speed of a flowing target object according to the present invention.

DETAILED DESCRIPTION OF THE PREFERRED EMBODIMENTS

Figure 1:
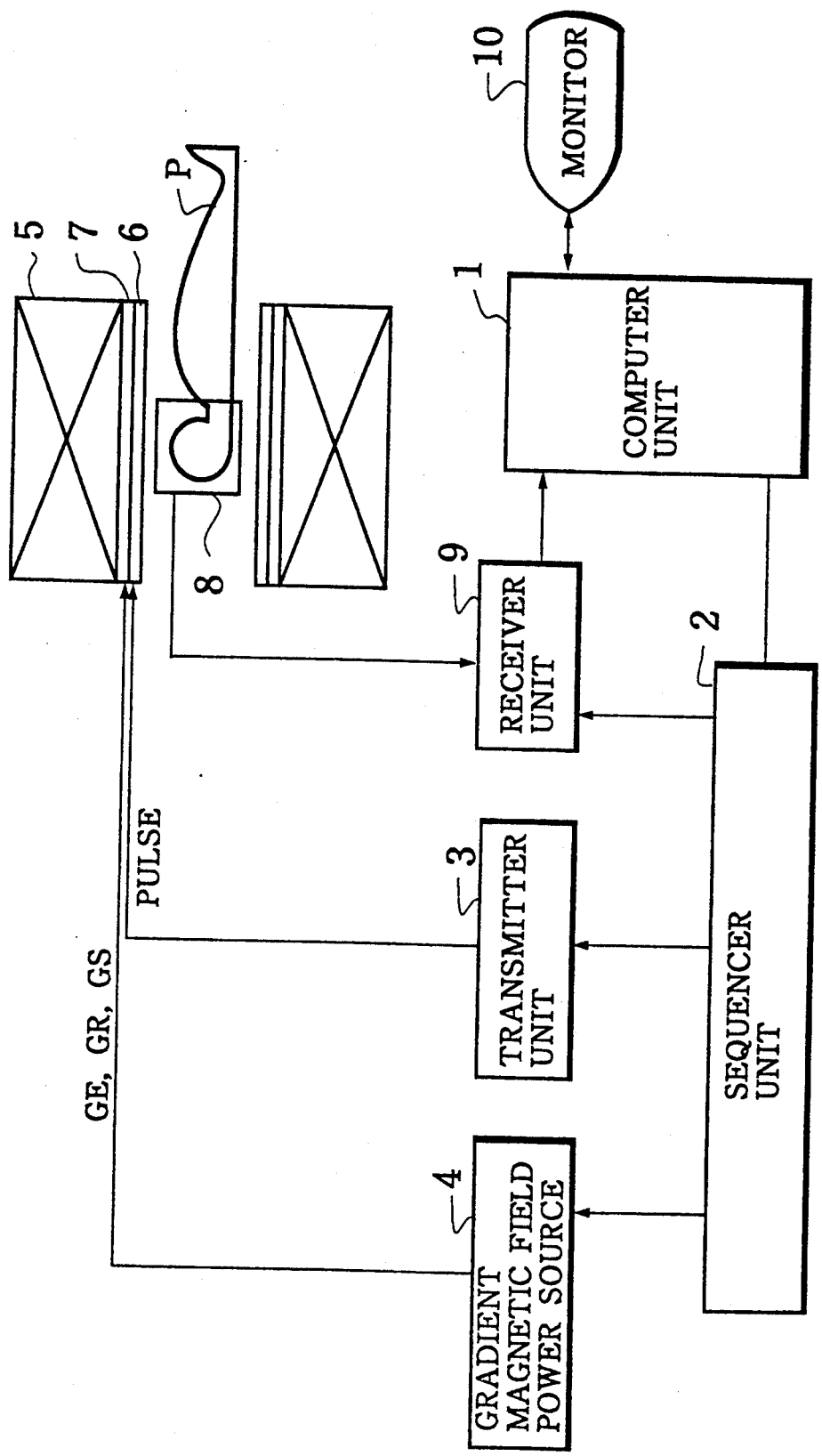
FIG. 1 is a schematic block diagram of a nuclear magnetic resonance imaging apparatus to be used in one embodiment of a nuclear magnetic resonance imaging for measuring a speed of a flowing target object according to the present invention.

Referring now to FIG. 1, one embodiment of a nuclear magnetic resonance imaging for measuring a speed of a flowing target object according to the present invention will be described in detail.

FIG. 1 shows a configuration of a nuclear magnetic resonance (NMR) imaging apparatus to be used in this embodiment. In this configuration of FIG. 1, the NMR imaging apparatus comprises: a main magnet 5 for generating a static magnetic field; an RF coil 6 for applying RF pulses to a patient P placed in the static magnetic field; gradient magnetic field coils 7 for generating encoding, reading, and slicing gradient magnetic fields $G_E$, $G_R$, and $G_S$ at an imaging target portion of the patient P placed in the static magnetic field; a probe 8 for receiving NMR signals emitted from the patient P in response to the application of the RF pulses; a transmitter unit 3 for driving the RF coil 6; a gradient magnetic field power source 4 for driving the gradient magnetic field coils 7; a receiver unit 9 for collecting the NMR signals received by the probe 8; a sequencer unit 2 for controlling the transmitter unit 3, the gradient magnetic field power source 4, and the receiver unit 9 to carry out a desired imaging pulse sequence stored therein; a computer unit 1 for controlling the operation of the sequencer unit 2, and reconstructing NMR images from the NMR signals collected by the receiver unit 9; and a monitor 10 for displaying the reconstructed NMR images.

In this configuration of FIG. 1, the sequencer unit 2 can control the gradient magnetic field power source 4 to drive the gradient magnetic field coils 7 such that the gradient magnetic fields can be applied as a pre-saturation pulse for saturating spin components at a desired saturation plane perpendicularly intersecting a direction of the blood flow within an imaging target blood vessel.

The sequencer unit 2 can also control the transmitter unit 3, the gradient magnetic field power source 4, and the receiver unit 9 to carry out a desired imaging pulse sequence such as a spin echo (SE) sequence or a field echo (FE) sequence, such that the gradient magnetic fields and the RF pulses appropriate for the desired imaging pulse sequence can be applied by the RF coil 6 and the gradient magnetic field coils 7 to a desired imaging region on the imaging target blood vessel in the patient P placed in the static magnetic field, and the NMR signals can be collected from the desired imaging region on the imaging target blood vessel in the patient P by the probe 8 and the receiver unit 9.

Using this NMR imaging apparatus of FIG. 1, the measurement of a speed of a flowing target object can be carried out as follows.

Namely, in this embodiment, the computer unit 1 controls the sequencer unit 2 to execute a single slice multi-phase pulse sequence in an electro-cardiograph gating (ECG) synchronization scheme, a peripheral pulse gating (PPG) synchronization scheme, or a respire gating (RG) synchronization scheme, where each phase of the single slice multi-phase pulse sequence includes an application of the pre-saturation pulse by the gradient magnetic field coils 7 followed by an execution of the desired imaging pulse sequence by the RF coil 6, the gradient magnetic field coils 7, and the probe 8, and such a phase is repeated for multiple times.

For example, in a case of using the ECG synchronization scheme, the timing relationships among the ECG waveform, the pre-saturation pulses, and the imaging pulse sequence will be as indicated in the timing chart of FIG. 2. Namely, the application of the first pre-saturation pulse takes place in synchronization with an R-wave of the ECG waveform, which is followed by the first execution of the desired imaging pulse sequence to obtain the NMR echo signals. Thereafter, in each phase of the single slice multi-phase pulse sequence, the application of the pre-saturation pulse is followed by the execution of the desired imaging sequence. Here, the same time interval $\Delta T$ is maintained for the interval $\Delta T1$ between the first pre-saturation pulse application and the first echo signal reception, the interval $\Delta T2$ between the second pre-saturation pulse application and the second echo signal reception, the interval $\Delta T3$ between the third pre-saturation pulse application and the third echo signal reception, and so on.

Then, by using the NMR signals collected at each phase of the single slice multi-phase pulse sequence, the NMR image of the imaging target blood vessel such as those as shown in FIGS. 3A, 3B, and 3C for the first, second and third phases, respectively, is reconstructed. In the reconstructed NMR image of the blood vessel, the saturation plane and the Tag portion due to the spin components saturated by the pre-saturation pulse appears as dark regions as indicated in FIGS. 3A, 3B, and 3C by the shaded regions.

Here, the first Tag portion for the first phase has flowed down the blood vessel for a distance d1 from the position of the saturation plane during the time interval $\Delta T1$ of the first phase, so that the first Tag portion appears to be displaced from the saturation plane by the distance d1 in the first reconstructed NMR image as shown in FIG. 3A.

Similarly, the second Tag portion for the second phase has flowed down the blood vessel for a distance d2 from the position of the saturation plane during the time interval $\Delta T2$ of the second phase, so that the second Tag portion appears to be displaced from the saturation plane by the distance d2, while the first Tag portion has flowed further down the blood vessel, in the second reconstructed NMR image as shown in FIG. 3B.

Likewise, the third Tag portion for the third phase has flowed down the blood vessel for a distance d3 from the position of the saturation plane during the time interval $\Delta T3$ of the third phase, so that the third Tag portion appears to be displaced from the saturation plane by the distance d3, while the second Tag portion has flowed further down the blood vessel and the first Tag portion which has flowed even further down the blood vessel is irregularly deformed by the turbulence in the blood flowing through the blood vessel, in the third reconstructed NMR image as shown in FIG. 3B.

Thus, from each NMR image reconstructed from the NMR signals collected at each phase of the single slice multi-phase pulse sequence, the distance d between the saturation plane and the Tag portion on the reconstructed NMR image is measured, and the speed of the blood flow is determined as $V = d/\Delta T$. Here, the distances d1, d2, d3, etc. obtained from different phases of the single slice multi-phase pulse sequence, may be different as the blood flows at different speeds at different heart beat phases. Consequently, the speeds obtained from a number of different phases of the single slice multi-phase pulse sequence are averaged in order to remove the temporal fluctuation factor.

Now, in this embodiment, it is preferable to use 180 degree pulse as the pre-saturation pulse, rather than a conventionally used 90 degree pulse.

When 180 degree pulse is used as the pre-saturation pulse, the concentration of the dark appearance of the saturation plane and the Tag portion in the reconstructed NMR image can be made greater, because the concentration of appearance of the regions containing the saturated spin components depends on the T1 relaxation time of the spin components. Consequently, it becomes easier to recognize the saturation plane and the Tag portion in the reconstructed NMR image.

In addition, when 180 degree pulse is used as the pre-saturation pulse, the irregular deformation of the boundary of the Tag portion can be suppressed, so that it becomes possible to measure the distance d between the saturation plane and the Tag portion more accurately, and consequently it becomes possible to determine the speed of the flowing target object more accurately. In a case of measuring the speed of the high speed blood flow, if 90 degree pulse is used as the pre-saturation pulse as usual, the boundary of the Tag portion will be irregularly deformed very quickly to make it difficult to make an accurate measurement.

As described, in this embodiment, it becomes possible to realize a nuclear magnetic resonance imaging capable of determining the speed of the flowing target object accurately, even for the high speed flowing target object, because the pre-saturation pulse is applied at each phase of the single slice multi-phase pulse sequence such that NMR image of the Tag portion can be obtained clearly, without any influence of the turbulence occurring in the flowing target object.

In addition, by using 180 degree pulse as the pre-saturation pulse, it becomes possible to improve the clarity of the Tag portion in the NMR image, such that the accuracy in the determination of the speed of the flowing target object can be improved.

It is to be noted here that, in the embodiment described above, although the use of the 180 degree pulse as the pre-saturation pulse is ideal as described above, the pre-saturation pulse having a pulse angle less than 180 degree, such as 170 degree for instance, may be used instead of the 180 degree pulse for the similar purpose of improving the clarity of the Tag portion in the NMR image.

It is also to be noted that, in the embodiment described above, the single slice multi-phase pulse sequence is carried out in ECG synchronization scheme, PPG synchronization scheme, or RG synchronization scheme for the purpose of increasing the accuracy in the determination of the speed of the flowing target object. However, it is not essentially important for the present invention to adopt such a synchronization scheme and the present invention is also effective when the single slice multi-phase pulse sequence is carried out without any synchronization scheme.

It is also to be noted that, although the embodiment has been described above for a case of measuring the speed of the blood flow, the present invention is equally applicable to the measurement of the other flowing target object such as cerebrospinal fluid.

It is further to be noted that, besides those already mentioned above, many modifications and variations of the above embodiments may be made without departing from the novel and advantageous features of the present invention. Accordingly, all such modifications and variations are intended to be included within the scope of the appended claims.

What is claimed is:

1. An apparatus for nuclear magnetic resonance imaging for measuring a speed of a flowing target object, comprising:

pre-saturation means for applying a pre-saturation pulse to a desired saturation plane perpendicularly intersecting a flowing direction of the flowing target object, so as to produce a saturated portion within the flowing target object;

imaging means for executing a desired imaging pulse sequence to collect nuclear magnetic resonance signals from a desired imaging region containing the saturation plane and the saturated portion;

control means for controlling the pre-saturation means and the imaging means to realize a single slice multi-phase pulse sequence, at each phase of which an application of the pre-saturation pulse by the pre-saturation means is followed by an execution of the desired imaging pulse sequence by the imaging means; and means for determining the speed of the flowing target object by reconstructing a nuclear magnetic resonance image of the desired imaging region from the nuclear magnetic resonance signals collected by the imaging means at each phase of the single slice multi-phase pulse sequence, measuring a distance between the saturated portion and the saturation plane in each reconstructed nuclear magnetic resonance image, and dividing the measured distance by a time interval between an application of the pre-saturation pulse and a reception of the nuclear magnetic resonance signals in the single slice multi-phase pulse sequence.

2. The apparatus of claim 1, wherein the pre-saturation means uses 180 degree pulse as the pre-saturation pulse.

3. The apparatus of claim 1, wherein the control means controls the pre-saturation means and the imaging means to realize the single slice single multi-phase pulse sequence in a synchronization scheme based on a periodic motion within a patient containing the flowing target object.

4. The apparatus of claim 3, wherein the synchronization scheme used by the control means is any one of an electrocardiograph gating (ECG) synchronization scheme, a peripheral pulse gating (PPG) synchronization scheme, and a respire gating (RG) synchronization scheme.

5. The apparatus of claim 3, wherein the control means controls the pre-saturation means and the imaging means to realize the single slice single multi-phase pulse sequence at each motion phase of the periodic motion within the patient.

6. A method of nuclear magnetic resonance imaging for measuring a speed of a flowing target object, comprising the step of:

applying a pre-saturation pulse to a desired saturation plane perpendicularly intersecting a flowing direction of the flowing target object, so as to produce a saturated portion within the flowing target object;

executing a desired imaging pulse sequence to collect nuclear magnetic resonance signals from a desired imaging region containing the saturation plane and the saturated portion;

controlling timings of the applying step and the executing step to realize a single slice multi-phase pulse sequence, at each phase of which an application of the pre-saturation pulse by the applying step is followed by an execution of the desired imaging pulse sequence by the executing step; and determining the speed of the flowing target object by reconstructing a nuclear magnetic resonance image of the desired imaging region from the nuclear magnetic resonance signals collected at the executing step at each phase of the single slice multi-phase pulse sequence, measuring a distance between the saturated portion and the saturation plane in each reconstructed nuclear magnetic resonance image, and dividing the measured distance by a time interval between an application of the pre-saturation pulse and a reception of the nuclear magnetic resonance signals in the single slice multi-phase pulse sequence.

7. The method of claim 6, wherein the applying step uses 180 degree pulse as the pre-saturation pulse.

8. The method of claim 6, wherein the controlling step controls the timings of the applying step and the executing step to realize the single slice single multi-phase pulse sequence in a synchronization scheme based on a periodic motion within a patient containing the flowing target object.

9. The method of claim 8, wherein the synchronization scheme used by the controlling step is any one of an electrocardiograph (ECG) synchronization scheme, a peripheral pulse gating (PPG) synchronization scheme, and a respire gating (RG) synchronization scheme.

10. The method of claim 8, wherein the controlling step controls the pre-saturation means and the imaging means to realize the single slice single multi-phase pulse sequence at each motion phase of the periodic motion within the patient.

* * * * *